(12) United States Patent
Borisov et al.

(10) Patent No.: US 7,372,373 B2
(45) Date of Patent: May 13, 2008

(54) EMBEDDED ANTENNA AND FILTER APPARATUS AND METHODOLOGY

(75) Inventors: Vladimir Borisov, Seneca, SC (US); Philippe Chiummiento, Seneca, SC (US); Semyon Lapushin, Tucker, GA (US); Sudhir Thumaty, Clemson, SC (US)

(73) Assignee: Itron, Inc., Liberty Lake, WA (US)

( * ) Notice: Subject to any disclaimer, the term of this patent is extended or adjusted under 35 U.S.C. 154(b) by 442 days.

(21) Appl. No.: 11/211,153

(22) Filed: Aug. 24, 2005

(65) Prior Publication Data

US 2006/0055610 A1    Mar. 16, 2006

Related U.S. Application Data

(60) Provisional application No. 60/604,973, filed on Aug. 27, 2004.

(51) Int. Cl.
*G08B 23/00*  (2006.01)

(52) U.S. Cl. .................. 340/870.02; 343/782; 301/659; 301/748; 301/761; 301/765; 333/12; 333/202; 324/84

(58) Field of Classification Search ........... 340/870.02; 343/782; 301/659, 748, 761, 765; 333/12, 333/202; 716/15; 324/84
See application file for complete search history.

(56) References Cited

U.S. PATENT DOCUMENTS

| | | | | |
|---|---|---|---|---|
| 4,963,843 A | * | 10/1990 | Peckham | ..................... 333/203 |
| 5,801,597 A | * | 9/1998 | Carter et al. | ................... 333/12 |
| 5,801,605 A | * | 9/1998 | Filakovsky | .................. 333/203 |
| 6,023,608 A | * | 2/2000 | Yrjola et al. | .................. 455/78 |
| 6,078,785 A | | 6/2000 | Bush | |
| 6,104,821 A | * | 8/2000 | Husung | ....................... 381/312 |
| 6,175,727 B1 | * | 1/2001 | Mostov | ....................... 455/307 |
| 6,636,406 B1 | * | 10/2003 | Anthony | ..................... 361/118 |
| 6,737,985 B1 | | 5/2004 | Garrard et al. | |
| 6,781,486 B2 | * | 8/2004 | Killen et al. | ................. 333/204 |
| 6,801,101 B2 | * | 10/2004 | Hiroshima et al. | .......... 333/134 |
| 6,876,056 B2 | * | 4/2005 | Tilmans et al. | ............. 257/528 |
| 7,111,271 B2 | * | 9/2006 | Li et al. | ....................... 716/15 |

OTHER PUBLICATIONS

"Current Affairs—Advance in AMR Technology" Metering International, Issue 2, 2000.

* cited by examiner

*Primary Examiner*—Albert K. Wong
(74) *Attorney, Agent, or Firm*—Dority & Manning, P.A.

(57) ABSTRACT

Apparatus and methodology are disclosed for providing effective transmission of data to and/or from an electricity meter by providing embedded radio frequency components. An antenna and stripline or microline filter arrangement are provided as embedded components in association with a transmitter or transceiver portion of the electricity meter's metrology circuitry so as to provide control of out of band harmonic radiation and to provide enhanced signal transmission to and/or from the electricity meter, to accomplish automated meter reading communications or similar. The antenna element is configured and mounted such that, once the electricity meter is fully assembled, the meter case itself can be used as part of a radiating element. An overall resulting integrated design can achieve greater economy utilizing printed circuit board approaches with no additional parts, and with less uncontrolled surface radiation because of the otherwise buried or embedded structure.

18 Claims, 3 Drawing Sheets

EMBEDDED ANTENNA AND FILTER APPARATUS AND METHODOLOGY

PRIORITY CLAIM

This application claims the benefit of U.S. Provisional Application No. 60/604,973, entitled "EMBEDDED ANTENNA AND FILTER APPARATUS AND METHODOLOGY", filed Aug. 27, 2004, which is incorporated herein by reference for all purposes.

FIELD OF THE INVENTION

The present subject matter generally concerns improved apparatus and methodology for providing radio frequency communication to and/or from electricity meters. More particularly, the present subject matter concerns combined radio frequency filter and antenna configurations achieving improved transmission characteristics to and/or from associated electricity meters.

BACKGROUND OF THE INVENTION

The present subject matter concerns both apparatus and methodology in such areas, including the use of embedded components in relation to printed circuit board components, for forming a transmitter or transceiver associated with an electricity meter.

A general object of metrology is to monitor a physical phenomenon to permit a record of the monitored event(s). If the ability to communicate recorded measurements or monitored data is impeded, then the basic purpose of the metering device and/or effort fails. Such basic function and purpose of metering devices can be applied to a number of contexts. One broad area of measurement relates, for example, to utility meters. These may include the monitoring of consumption of a variety of forms of energy or other commodities, such as electricity, water, gas, and oil, to name a few.

Historically, a mechanical form of register was used for utility meters. Such an approach provided a relatively dependable field device with certain inherent functional advantages. For example, if the flow of the consumable commodity being measured was interrupted, the mechanical form of gauge simply stopped in its place, automatically reflecting the previous accumulation without other arrangements being required, and without any loss of such accumulated data. After resumption of the flow of the commodity, the mechanical register could then simply begin to add additional flow values to the previous accumulation, so that accurate data was reflected at all times regardless of intermittent commodity flow interruptions.

Also, in many instances, the gauge or register required no separate power supply since it was operated directly by the commodity flow. In the case of electricity meters, the mechanical register could be electrically powered. Hence, when power was lost, the measurement function was temporarily moot so no measurement functionality was lost even though the gauge itself would be temporarily without power.

As the technology of metering devices progressed, mechanical registers began to be replaced with more electrical-based devices and electronic forms of registers. In addition, data transmission devices have been introduced that permit remote reading and/or control of utility meters, thus relieving utility companies of the need to visually inspect meters to obtain periodic reading, or of the need to visit a meter to undertake certain communications (for example, such as instructions) directed to the meter.

For example, in the case of an electricity meter, electric power is already flowing to and through the metering or measuring device. Such fact makes for a convenient supply of electricity, without having to attempt to rely on battery operation or some other source of electrical power. Thus, there is a ready source available to provide power for onboard transmitters and/or transceivers that may be used to transmit collected data to a remote location and/or to receive various command and/or control signals designed to modify or control the operation of the utility meter.

Regardless of such uses for communications, an inherent problem exists due in part to the fact that, when a relatively large number of such devices are in use, interference with other such devices or with other devices operating on similar frequencies, can create errors in the reception of transmitted data or control signals to or from the utility meter. Prior attempts have been made to address such technical problem.

U.S. Pat. No. 6,737,985 to Garrard et al. for Remote Metering, issued May 18, 2004, discloses an electricity meter including, among other features, an antenna system 120.

U.S. Pat. No. 6,078,785 to Bush for Demand Reporting of Electricity Consumption by Radio in Relays to a Base Station, and Demand Relays Wattmeters So Reporting Over a Wide Area, issued Jun. 20, 2000, discloses an electricity meter including an antenna that may correspond to a loop integral to a non conductive portion of the case.

A 2000 article entitled "Current Affairs—Advances in AMR technology" briefly discusses the use of PCS wireless modems with automated electricity meter reading systems using proprietary antenna fully contained within the meter chassis.

BRIEF SUMMARY OF THE INVENTION

In view of the recognized features encountered in the prior art and addressed by the present subject matter, improved apparatus and methodology for transmission of radio frequency (RF) signals relating to metrology operations within electric meters are disclosed. More particularly, a particular aspect of certain embodiments of the present subject matter involves improved antenna radiation patterns from antennas coupled to transmitters or transceivers associated with utility meters.

Another broader present aspect is to accomplish improved automated meter reading communications and/or improved command and control communications from and/or to an electricity meter.

Another more particular aspect of certain embodiments of the present subject matter relates to providing reduced interference in out of band signals from transmitters (or transceivers) associated with utility meters. In such context, it is a general aspect of the present subject matter to provide for reduced harmonic frequency radiation from low-cost transmitters associated with utility meters.

It is another of the broader aspects of the present subject matter to advantageously utilize embedded radio frequency components. More particularly, for example, in such context, it is a present advantage to in certain embodiments provide for stripline or microline filter arrangements combined with antenna features, all in an embedded context.

It is a still further present advantage, for some particular present embodiments, to provide an antenna element configured and mounted such that, once the electricity meter is fully assembled, the meter case itself contributes as a part or all of a radiating element.

Additional aspects and advantages of the present subject matter are set forth in, or will be apparent to those of ordinary skill in the art from, the detailed description herein. Also, it should be further appreciated that the modifications and variations to the specifically illustrated, referenced, and discussed features and steps hereof may be practiced in various embodiments and uses of this subject matter without departing from the spirit and scope thereof, by virtue of present reference thereto. Such variations may include, but are not limited to, substitution of equivalent means and features or steps for those shown, referenced, or discussed, and the functional, operational, or positional reversal of various parts, features, steps, or the like.

Still further, it is to be understood that different embodiments, as well as different presently preferred embodiments, of this subject matter may include various combinations or configurations of presently disclosed steps or features, or their equivalents (including combinations of steps or features or configurations thereof not expressly referenced in the figures or stated in the detailed description).

One exemplary embodiment of the present subject matter relates to an improved antenna design that manages in a positive manner the unavoidable radio frequency (RF) parasitics presented by mechanical association of an antenna within a metallic housing environment, thus providing for improved efficiency of radiation.

Other exemplary embodiments of the present subject matter may make use of embedded filters to limit harmonic radiation that may impair the operation of other nearby electronic equipment. As another aspect of the present subject matter, such embedded filters may employ a design utilizing a multilayer printed circuit board and thereby limit the need for other expensive components.

Other exemplary embodiments of the present subject matter relate to a utility meter, having a metrology portion, a transmitter portion configured to transmit radio frequency signals at a predetermined frequency, and a display portion. In such embodiment, the transmitter portion may advantageously further comprise a printed circuit board supporting a transmitter, and there may be provided with the utility meter an antenna and a filter respectively embedded in such circuit board. Such an exemplary filter configuration preferably involves the filter being connected between the transmitter and the antenna. Additional details of the filter may be specified in some embodiments thereof (though not necessarily required in others) in which the filter comprises a predetermined number of quarter-wave tuned resonators tuned to a predetermined number of selected harmonics of the predetermined frequency.

Still further, other present embodiments may relate to an electricity meter with embedded radio frequency features to provide control of out of band harmonic radiation. Such present exemplary electricity meters may include, for example, a metrology portion, a printed circuit board, a transmitter supported on such a printed circuit board and configured to transmit radio frequency signals at a predetermined frequency, an antenna embedded in such a printed circuit board, and a filter embedded in such printed circuit board. The filter may preferably be connected between the transmitter and the antenna and may prefereably comprise one of a stripline filter and a microline filter. In such exemplary present electricity meters provided with embedded radio frequency features, the result is enhanced electricity meter data signal communications for effective communication of data such as for automated meter reading communications or related.

Certain present exemplary embodiments relate in greater manner to a stripline filter for reducing harmonic radiation from a transmitter designed for operation at a predetermined frequency. Such an exemplary filter may comprise a stripline transmission line extending from a first terminal to a second terminal, a first pair of quarter-wave tuned resonators tuned to a first predetermined harmonic of a predetermined frequency and coupled to the stripline transmission line, and a second pair of quarter-wave tuned resonators tuned to a second predetermined harmonic of the predetermined frequency and coupled to the stripline transmission line. In certain of such exemplary stripline filter embodiments, a printed circuit board may be provided, where the stripline transmission line, the first pair of quarter-wave tuned resonators, the second pair of quarter-wave tuned resonators, and the fifth quarter-wave tuned resonator are all embedded in the printed circuit board. In other, alternative stripline filter embodiments, all such features may be formed on, rather than embedded in, the associated printed circuit board.

Still further present aspects relate to corresponding methodology, it being intended as understood by those of ordinary skill in the art that such corresponding methodology equally forms part of the present disclosure. Broadly speaking, one exemplary such present methodology relates to a method for reducing harmonic frequency radiation from a printed circuit board, comprising the steps of: providing a printed circuit board and including thereon a transmitting portion configured for transmission of radio frequency signals at a predetermined frequency; embedding in such printed circuit board an antenna, with such antenna configured so as to radiate the predetermined frequency; embedding in the printed circuit board a filter, such filter including at least one paired portion tuned to a predetermined harmonic of the predetermined frequency; and connecting the filter between the transmitting portion and the antenna.

In accordance with aspects of certain embodiments of the present subject matter, each such embedded filter may be configured to minimize uncontrollable surface radiation otherwise resulting from the use of individual filter components.

Additional embodiments of the present subject matter, not necessarily expressed in this summarized section, may include and incorporate various combinations of aspects of features, components, or steps referenced in the summarized objectives above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
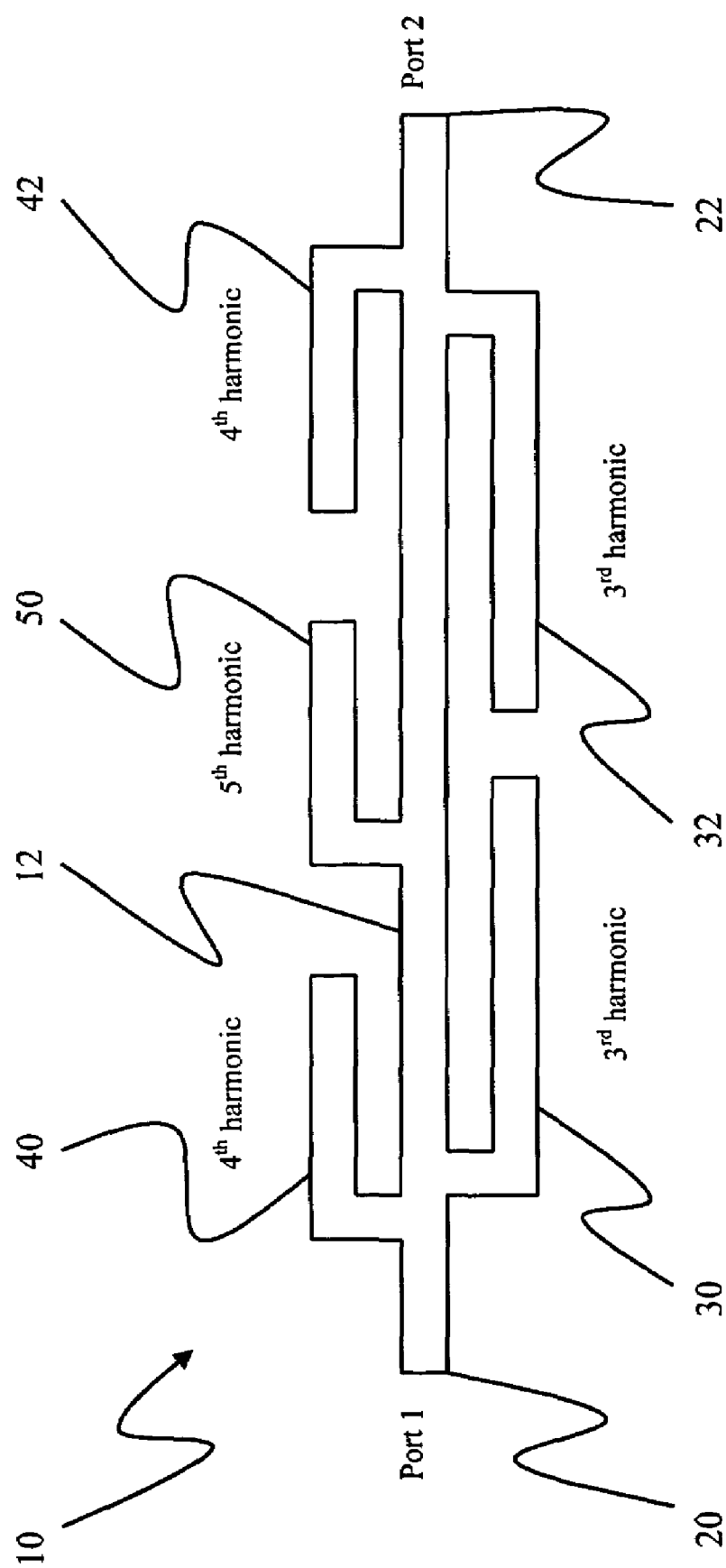
FIG. 1 is a diagrammatic illustration of an exemplary configuration of an exemplary filter constructed in accordance with the present subject matter.

Repeat use of reference characters throughout the present specification and appended drawings is intended to represent same or analogous features, elements or steps of the present subject matter.

DETAILED DESCRIPTION OF THE PREFERRED EMBODIMENTS

As discussed in the Brief Summary of the Invention section, the present subject matter is particularly concerned with improved apparatus and methodology for the transmission of radio frequency (RF) signals relating to metrology operations within utility meters, for example, such as electric meters. As a general non-limiting example, a medium-powered RF transmitter operating in the 900 MHz (mega Hertz) ISM (Industrial, Scientific, Medical) band of frequencies (generally 902 MHz to 928 MHz) generates considerable power output at the third, fourth and fifth harmonics that fall into FCC (Federal Communications Commission) restricted bands. Thus, specific harmonics filtering is needed to bring the level of emissions under government regulated limits.

Traditional designs utilize lumped band-pass and/or low-pass filters to carry out the task of harmonic suppression. Implementation of such filters has been difficult, mostly due to creation of parasitic pass-bands and uncontrolled radiation from the filter itself. In addition, the use of individual components adds unnecessarily to the overall cost of such filters.

With specific reference to FIG. 1, a diagrammatic illustration is shown of an exemplary configuration of a stripline filter 10 constructed in accordance with the present subject matter. The present subject matter provides an economical stripline filter 10 that may be incorporated into a regular multi-layer printed circuit board, and which otherwise addresses many of the concerns identified with respect to previous developments in the art. More specifically, the stripline filter 10 in accordance with present subject matter avoids the use of individual components that may themselves be a source of uncontrollable radiation.

As illustrated in FIG. 1, the stripline filter 10 in accordance with the present subject matter comprises a transmission line portion generally 12 extending between a first port 20 and a second port 22. Such ports 20 and 22 may be designated as input and output ports, although the order may be electrically reversed, as the exemplary filter structure illustrated is symmetrical. Such symmetry may not be exhibited, however, in other designs so that symmetry of filter design is not a necessary limitation of the present subject matter.

With further reference to FIG. 1, the stripline filter 10 in accordance with the present subject matter may correspond, for example, to a plurality of bowed quarter-wave resonators generally arranged in pairs and distributed along the transmission line 12. Such quarter-wave resonators may be configured as notch filters, whereas low-pass or band-pass filters may have been types of filters previously employed in other configurations (i.e., non-stripline embodiments) of filters. Thus, quarter-wave resonators 30 and 32, as illustrated, may each be tuned to the third harmonic of the transmitter operating frequency. In the exemplary configuration, such frequency may correspond to about 2,700 MHz or 2.7 GHz (i.e., three times the base or fundamental frequency of 900 MHz), as well understood by those of ordinary skill in the art.

In like manner, resonators 40 and 42, as illustrated, may correspond to quarter-wave resonators tuned to the fourth harmonic of the exemplary base 900 MHz frequency, while resonator 50 may correspond to a quarter-wave resonator tuned to the fifth harmonic of the exemplary base 900 MHz frequency.

FIGS. 2a through 2d individually correspond to equivalent circuit representations of the stripline filter 10 corresponding to the base frequency and harmonics thereof particularly of interest (i.e., third, fourth, and fifth) according to the present subject matter.

Figure 2A:
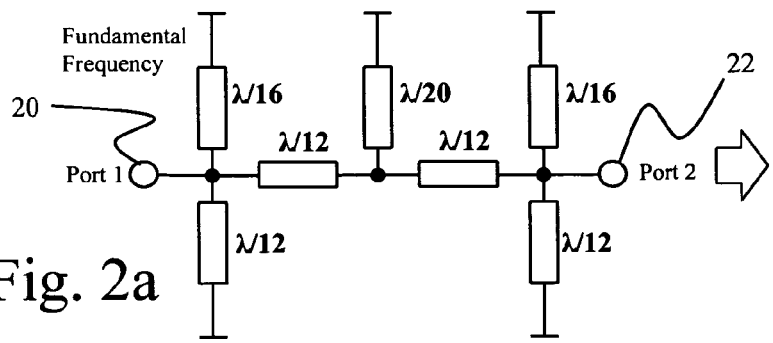
FIGS. 2a through 2d, inclusive, represent examples of equivalent circuits at different frequencies of the exemplary filter illustrated in FIG. 1.
Figure 2A:
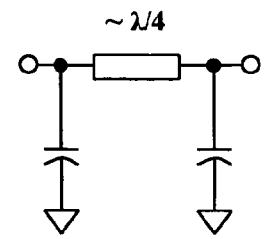

In particular, FIG. 2a representatively illustrates an equivalent circuit of the stripline filter 10 as it may appear electrically while operating at a fundamental frequency within the 900 MHz ISM frequency band. As illustrated in FIG. 2a, with respect to a fundamental operating frequency, the stripline filter 10 may be represented as a series and parallel configuration of substantially symmetrically arranged transmission lines of selected lengths. More specifically, in the case of the fundamental frequency representation of FIG. 2a, ports 20 and 22 (Port 1 and Port 2, respectively), as shown, may both be considered to be equivalently coupled to the junction of a $\lambda/16$ wavelength transmission line and a $\lambda/12$ wavelength transmission line, the opposite ends of each of which may be representatively shown as coupled to a common ground plane. As is customary in representations like those of FIGS. 2a through 2d, the Greek symbol lambda ($\lambda$) is understood to represent wavelength.

Coupled to the junction points of the two $\lambda/16$ and $\lambda/12$ series coupled transmission lines are a pair of series connected $\lambda/12$ transmissions lines whose common connection point may be represented as coupled by way of a $\lambda/20$ transmission line connected to the previously mentioned common reference plane (see upper portion of the illustration of FIG. 2a).

With further reference to FIG. 2a, it will be observed that the just described equivalent representation of the stripline filter 10 may be further reduced as represented by the unmarked right-hand side arrow head to a simpler form illustrated on the right hand portion of FIG. 2a. Such reduced or simplified illustration and representation corresponds to a pair of capacitors coupled respectively to ports 20 and 22 and a corresponding representation of a common ground plane together with a single transmission line segment of approximately $\lambda/4$ coupled between port 20 and port 22.

Figure 2B:
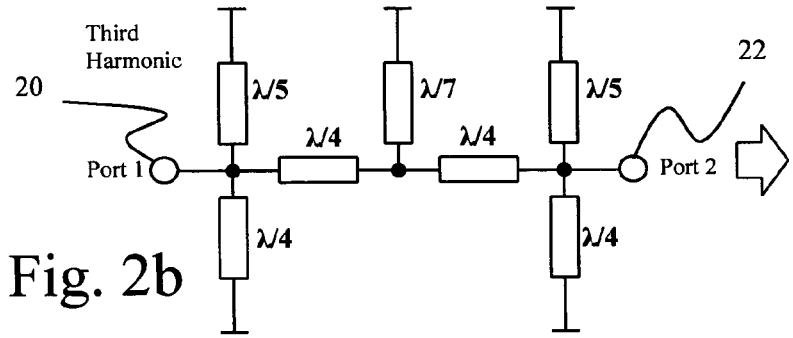
Figure 2B:
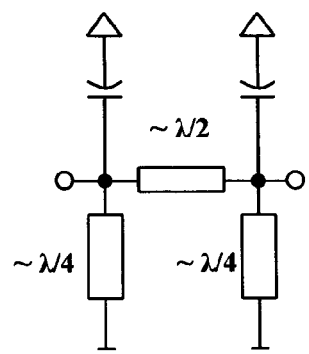
Figure 2C:
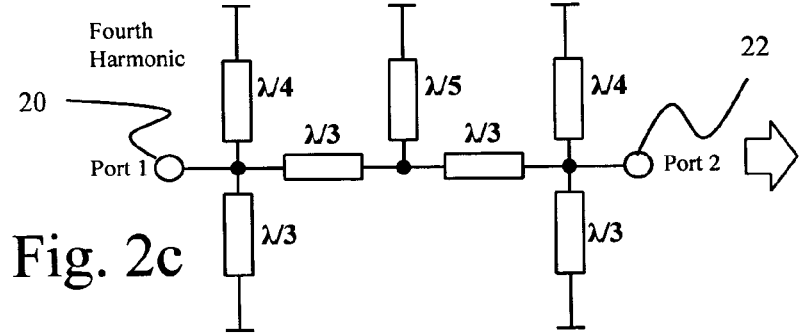
Figure 2C:
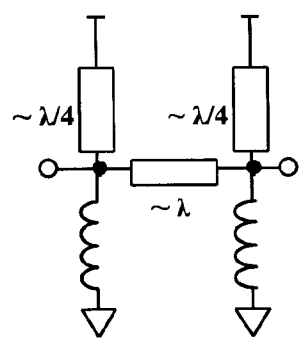
Figure 2D:
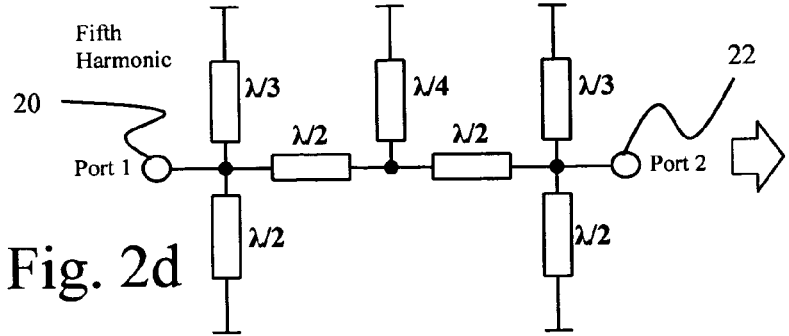
Figure 2D:
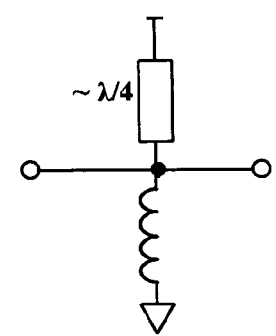

In accordance with the present technology, the third, fourth and fifth harmonic operational equivalents may correspond to elements as illustrated in FIGS. 2b through 2d, respectively. As will be observed from an examination of such Figures, the initial representation in each of such equivalent circuit representations is structurally identical to that illustrated in FIG. 2a representing the fundamental frequency equivalent of the stripline filter 10 except that the various lengths of the transmission line representations for each differ as illustrated in the corresponding Figures.

In addition to the above noted differences in lengths of transmission line representations for the various harmonics, the second, reduced component equivalent circuit representations (right-hand portions of each respective illustration of FIGS. 2b through 2d) differ somewhat from that of the fundament frequency to the various harmonic frequencies as illustrated, respectively, in the right hand portion of each of the FIGS. 2a through 2d. However, in each instance, those of ordinary skill in the art will understand that such illustrations make use of indicated capacitors (illustrations of right-hand side of FIGS. 2a and 2b) or inductors (illustrations of right-hand side of FIGS. 2c and 2d), as well as various nodes, connections with common ground planes, and specific exemplary approximated transmission line lengths.

Figure 3:
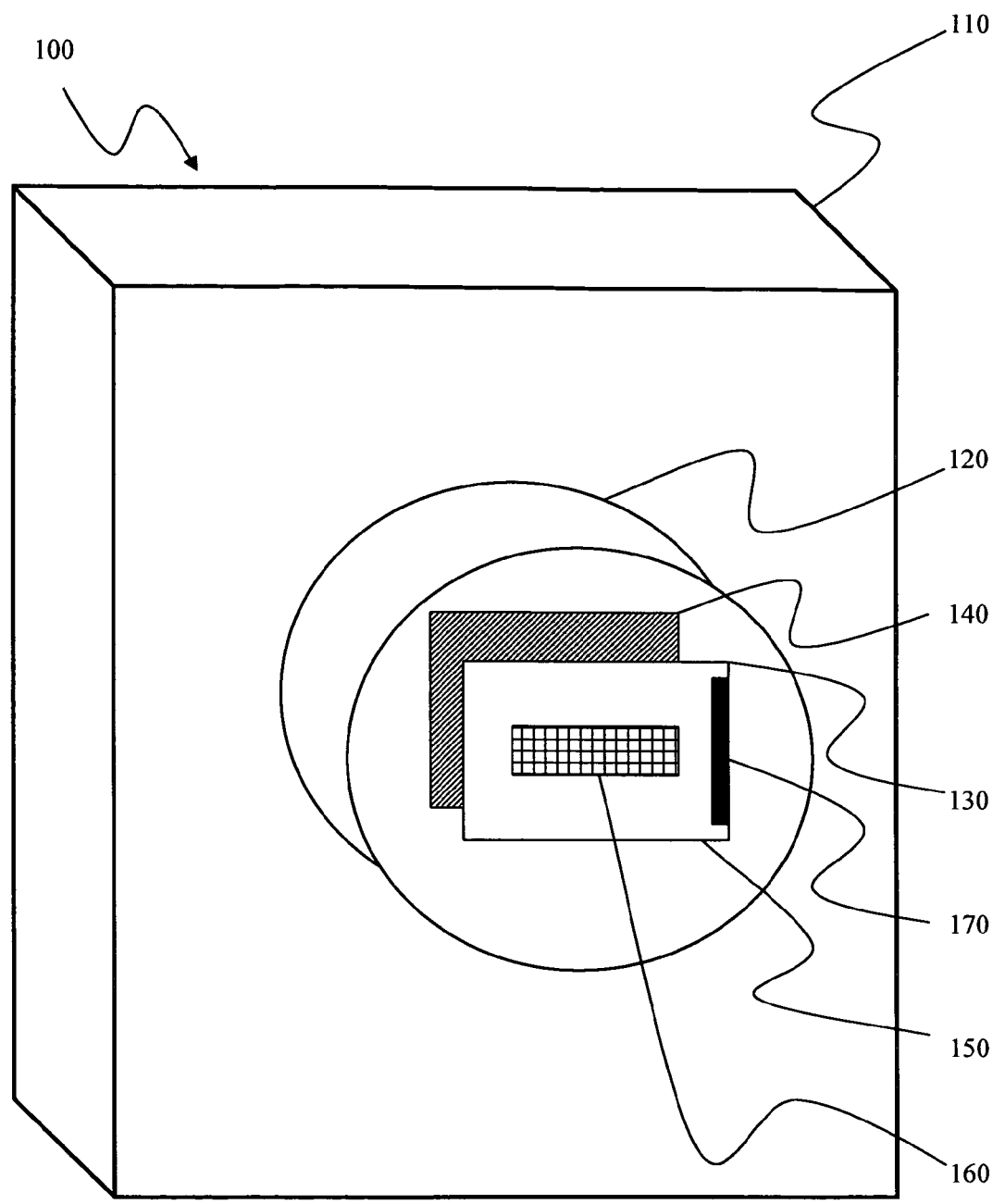
FIG. 3 representatively illustrates the mounting of an antenna within a utility meter in accordance with the present subject matter.

With reference now to FIG. 3, an additional aspect of the present technology will be discussed in more detail, more specifically involving a methodology for providing an embedded antenna for association with a transmitter or transceiver associated with a utility meter, such as an electricity meter.

Illustrated in FIG. 3 is an electricity meter generally 100 that includes, in an installed configuration, a metallic housing 110 to which may be couple a metrology assembly generally 130 that may be plugged into matching connectors (not shown) positioned within a circular opening 120 within the face of the metallic housing 110. The metrology assembly or components 130 of the exemplary representative electric meter 100 are representatively illustrated as corresponding to a metrology circuit board 140, a radio frequency (RF) transmitter or transceiver board 150 and a display panel 160. Display panel 160 may correspond to a liquid crystal display (LCD) or any other type of display as may be selected from those known in the art or yet to be developed. The particular form of (or even the presence of) a display does not form a limitation to the present subject matter. Each of such components (i.e., the metrology board 140, the transmitter/transceiver board 150 and the display panel 160) are coupled together by suitable interconnections (not shown but well understood to those of ordinary skill in the art) as may be specifically required in a given embodiment of the present subject matter to permit proper operation of the exemplary representative electricity meter.

With further reference to the transmitter/transceiver board 150, an antenna 170 may be embedded into the printed circuit board on which the components corresponding to the transmitter/transceiver are mounted. Antenna 170 may be embedded in the same manner as was previously discussed with respect to the stripline filter 10 with reference to FIGS. 1 and FIGS. 2a through 2d, respectively. In certain embodiments of the present subject matter, both the antenna 170 and stripline filter 10 may be embedded together as parts of a multi-layer printed circuit board otherwise corresponding to (i.e., serving as) the transmitter/transceiver board 150. In other embodiments, antenna 170 may be formed on the printed circuit board rather than embedded therein. Similarly, a microline filter arrangement may be practiced in place of a stripline filter. Also, optionally, housing or meter case 110 may be operatively associated with antenna 170 for forming a portion or all of a radiating element of the antenna, once the meter with case 110 is fully assembled.

Design principles relating to specific placement of the antenna 170 within, for example, the transmitter/transceiver board 150 will take into consideration antenna orientation as well as the physical presence and effect on the antenna radiation pattern that the electricity meter housing and any connecting conduits and electrical wiring may have on the antenna performance. The antenna may also be designed to provide radiation in two orthogonal polarizations, i.e., dual polarization characteristics, in order to increase transmission range and reliability, all in accordance with the present subject matter. In many cases, electricity meters will not be within the line of sight of transmitters/transceivers wishing to communicate with the electricity meter. In such case polarization diversity may be of assistance in improving the reliability of such non line of sight communications.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for reducing harmonic frequency radiation from a printed circuit board, comprising the steps of:
   providing a printed circuit board and including thereon a transmitting portion configured for transmission of radio frequency signals at a predetermined frequency;
   embedding in said printed circuit board an antenna, with said antenna configured so as to radiate said predetermined frequency;
   embedding in said printed circuit board a filter, said filter including at least one paired portion tuned to a predetermined harmonic of said predetermined frequency; and
   connecting said filter between said transmitting portion and said antenna.

2. A method as in claim 1, wherein said step of embedding in said printed circuit board a filter comprises embedding a stripline filter in said printed circuit board.

3. A method as in claim 2, wherein said step of embedding a stripline filter in said printed circuit board comprises embedding in said printed circuit board a predetermined number of quarter-wave tuned resonators tuned to a predetermined number of selected harmonics of said predetermined frequency.

4. A method as in claim 1, wherein said step of embedding in said printed circuit board a filter comprises embedding a microline filter in said printed circuit board.

5. A method as in claim 1, wherein said step of embedding in said printed circuit board a filter comprises embedding a filter including at least two paired portions tuned to different predetermined harmonics of said predetermined frequency.

6. A method as in claim 5, wherein said step of embedding a filter in said printed circuit board comprises the step of embedding in said printed circuit board a stripline filter comprising a transmission line portion, a pair of third harmonic portions, a pair of fourth harmonic portions, and a fifth harmonic portion.

7. A method as claim 1, wherein said step of providing a printed circuit board and including thereon a transmitting portion further includes providing a receiving portion included on said printed circuit board and operatively associated with said transmitting portion for forming a transceiver function on said electricity meter.

8. A method as claim 1, wherein:
   said method further includes the step of providing an electricity meter; and
   said step of providing a printed circuit board and including thereon a transmitting portion further includes mounting said printed circuit board within said electricity meter for forming a transmitter function for said electricity meter.

9. A method as in claim 8, wherein said step of providing an electricity meter includes providing an electricity meter case operatively interconnected with said antenna so as to function as part of a radiating element of said antenna.

10. A utility meter, comprising:
a metrology portion;
a transmitter portion configured to transmit radio frequency signals at a predetermined frequency; and
a display portion;
wherein said transmitter portion comprises a printed circuit board supporting a transmitter, and with an antenna and a filter respectively embedded in said circuit board, with said filter being connected between said transmitter and said antenna, and with said filter comprising a predetermined number of quarter-wave tuned resonators tuned to a predetermined number of selected harmonics of said predetermined frequency.

11. A utility meter as in claim 10, wherein said filter is a stripline filter.

12. A utility meter as in claim 10, wherein said quarter-wave tuned resonators are tuned to the third, fourth, and fifth harmonics of said predetermined frequency.

13. A utility meter as in claim 10, further comprising a housing, wherein said housing is configured to function as a portion of said antenna.

14. A utility meter as in claim 10, wherein said utility meter is an electricity meter, and further wherein said transmitter portion further includes receiver features, operatively interconnected with said transmitter portion for forming transceiver features for said electricity meter.

15. An electricity meter with embedded radio frequency features to provide control of out of band harmonic radiation, said electricity meter comprising:
a metrology portion;
a printed circuit board;
a transmitter, supported on said printed circuit board and configured to transmit radio frequency signals at a predetermined frequency;
an antenna embedded in said printed circuit board; and
a filter embedded in said printed circuit board, with said filter being connected between said transmitter and said antenna and comprising one of a stripline filter and a microline filter, whereby said electricity meter with embedded radio frequency features provides enhanced electricity meter data signal communications for effective communication of data such as for automated meter reading communications or related.

16. An electricity meter as in claim 15, wherein said transmitter has operatively associated therewith a receiver portion, for collectively forming transceiver features, for respectively transmitting signals to and from said electricity meter via said antenna.

17. An electricity meter as in claim 15, wherein said filter includes a predetermined number of quarter-wave tuned resonators tuned to a predetermined number of selected harmonics of said predetermined frequency.

18. An electricity meter as in claim 15, wherein:
said electricity meter further includes a meter case; and
said antenna is configured and mounted such that, once said electricity meter is fully assembled, said meter case performs as part of a radiating element of said antenna, to provide an overall resulting integrated design utilizing printed circuit board approaches with no required additional parts, and with less uncontrolled surface radiation.

* * * * *